United States Patent
Lintonen et al.

(10) Patent No.: US 9,118,458 B1
(45) Date of Patent: Aug. 25, 2015

(54) CLOCK PHASE ALIGNMENT

(71) Applicant: Telefonaktiebolaget L M Ericsson (publ), Stockholm (SE)

(72) Inventors: Mikko Lintonen, Oulu (FI); Jukka Kohola, Oulu (FI); Marko Pessa, Oulu (FI); Olli Varkki, Oulu (FI)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/260,622

(22) Filed: Apr. 24, 2014

(51) Int. Cl.
*H03D 3/24* (2006.01)
*H04L 7/033* (2006.01)
*H04L 7/00* (2006.01)
*H04W 52/02* (2009.01)

(52) U.S. Cl.
CPC .............. *H04L 7/033* (2013.01); *H04L 7/0012* (2013.01); *H04W 52/02* (2013.01)

(58) Field of Classification Search
CPC ........... H03L 7/07; H03L 7/0814; H03L 7/06; H03L 7/087; G11C 7/222; G06F 1/06; H04L 7/0337; H04L 7/0008; H04J 3/0688
USPC .......... 375/354, 362, 371, 376; 327/141, 147, 327/163, 251; 714/731, 744
See application file for complete search history.

(56) References Cited

U.S. PATENT DOCUMENTS

| | | | |
|---|---|---|---|
| 5,122,677 A * | 6/1992 | Sato ................................. 327/99 |
| 6,118,314 A | 9/2000 | Arnould et al. | |
| 6,188,286 B1 | 2/2001 | Hogl et al. | |
| 6,333,653 B1 | 12/2001 | Floyd et al. | |
| 6,873,195 B2 * | 3/2005 | Dormitzer et al. ............ 327/163 |
| 6,954,097 B2 * | 10/2005 | Harrison ....................... 327/237 |
| 7,965,111 B2 | 6/2011 | Sun et al. | |
| 8,188,782 B1 | 5/2012 | Lai et al. | |
| 2010/0066425 A1 * | 3/2010 | Hiraku .......................... 327/298 |
| 2010/0091591 A1 * | 4/2010 | Byun ............................. 365/193 |
| 2011/0163785 A1 * | 7/2011 | Chen et al. .................... 327/144 |
| 2014/0097877 A1 * | 4/2014 | Baeckler et al. .............. 327/149 |
| 2014/0223220 A1 * | 8/2014 | Guntur et al. ................. 713/501 |

FOREIGN PATENT DOCUMENTS

CN          102361456 A          2/2012

* cited by examiner

*Primary Examiner* — Khanh C Tran
(74) *Attorney, Agent, or Firm* — Coats & Bennett, PLLC

(57) ABSTRACT

A clock generation circuit is operative to disable and enable a plurality of output clock signals while maintaining predetermined phase relationships between the clock signals. A reference clock signal is divided by a factor of at least two, to generate a master clock signal. A plurality of phase circuits, each independently enabled, generates a plurality of output clock signals by dividing the reference clock signal. The output clock signals have predetermined phase relationships relative to each other. Each phase circuit is enabled synchronously to a synchronization edge of the master clock signal. A synchronization circuit associated with each phase circuit ensures synchronization with the master clock signal by outputting a phase circuit enable signal only upon the conditions of a clock enable signal associated with the output clock being asserted and the receipt of a predetermined number of master clock signal synchronizing edges.

14 Claims, 5 Drawing Sheets

CLOCK PHASE ALIGNMENT

FIELD OF INVENTION

The present invention relates generally to clock circuits for digital electronics, and in particular to a method and apparatus for maintaining relative phase relationships between clocks as one or more are disabled and enabled.

BACKGROUND

Portable electronic devices are ubiquitous accoutrements in modern life. Cellular telephones, smartphones, satellite navigation receivers, e-book readers and tablet computers, wearable computers (e.g., glasses, wrist computing), cameras, and music players are just a few examples of the many types of portable electronic devices in widespread use. Portable electronic devices are powered by batteries—either replaceable batteries such as alkaline cells, or rechargeable batteries such as NiCd, NiMH, LiOn, or the like. In either case, the useful life of portable electronic devices is limited by available battery power, which decreases in proportion to the length of use of the device, and the level of power consumption during that use.

Trends in portable electronic device design exacerbate the problem of limited available power. First, device form factors tend to shrink, due to increasing integration of electronics and miniaturization of component parts, such as disk drives. This forces the size of the battery to shrink as well, which generally reduces the available energy storage capacity. Second, electronic devices are increasingly sophisticated, offering new applications, more sophisticated user interfaces, enhancements such as encryption, and the like. The additional software implementing these features requires increased computational power to execute, which translates to larger, or additional, processors and more memory. Finally, successive generations of portable electronic device often add additional features such as various modes of wireless connectivity, which may require the integration of additional chip sets and other electronics. An increase in the demand for power by more processors and circuits, coupled with ever-shrinking battery size and capacity, has made power management a critical area of optimization for portable electronic device designers.

Several approaches to power management are known in the art. One such approach is to identify circuits (or sub-circuits) that are not used for extended periods, and put them into a low-activity state, also referred to as a "sleep mode," even if other circuits in the device are fully active. As one example, the illuminated display screen of many devices will shut off after a (selectable) duration of no user interactivity. One way to shut down digital circuits is to isolate clocks signals from these circuits. Since storage elements within the digital circuits only change state in response to clock signal edges or levels, power-consuming electrical activity within the circuits effectively ceases.

Another approach to power management is to selectively provide operating power to various circuits (or sub-circuits) only as it is required. This selective power supply approach is possible by dedicating switched mode power supplies to each circuit. As well known in the art, a switched mode power supply transfers discrete quanta of charge from a power source (such as a battery) into a power storage and integration device (such as an inductor or capacitor), from which the power is made available to the circuit. By disabling the clocking signal used by a switched mode power supply, the circuits served by the power supply are rendered non-operative until the clock is again enabled and the power supply again begins switching charge from the power source to the load.

Even when several discrete circuits of a portable electronic device are simultaneously active, it may be advantageous to balance the current drain from the battery over time—that is, reduce or eliminate current "surges" caused by simultaneous clocking of digital electronics in several independent circuits, and/or the simultaneous switching of charge from the battery by numerous power supplies. One way to achieve such balance is by staggering the relative phases of the clock signals distributed to the disparate circuits or power supplies.

A clock generation and management approach that provides flexibility in clock enablement and relative phase for a plurality of discrete clock signals would be beneficial in power management for modern portable electronic devices. However, known clock management circuits lose phase synchronization between multiple clocks when one or more of the clock signals is disabled, and later enabled.

FIG. 1 depicts a reference clock signal Clk_in, and three output clock signals, each having a predetermined phase shift relative to each other. FIG. 1 also depicts a clock enable signal for the first output clock signal (other clocks are continuously enabled). During a first duration of output signal Clk1_phase_shifted being enabled, beginning at time $t_1$, the three output clock signals have the phase shifts, referenced to the first clock signal, as indicated in the second column of the table. That is, the second clock has a delay offset from the first clock by $\pi/2$, or 90°, and the third clock has a delay offset from the first clock by $\pi$, or 180° (that is, opposite phase). At time $t_2$, the first output clock signal is disabled, effectively placing a circuit or switched mode power supply in a "sleep" mode. When the circuit or power supply is again required to be active, the first clock is again enabled at time $t_3$, and begins oscillating at time $t_4$. However, the re-enabled first clock is shifted in phase, relative to its prior operation, by $\pi$, or 180° (the phase shift listed in the table of FIG. 1 for the first output clock is 0 because it is the reference position—the table lists phase changes relative to the first output clock). This shift in the first clock's phase (relative to its earlier phase) alters the phase relationship of the other two clocks relative to the first clock. The second clock now has a leading offset from the first clock of pi/2, or 90°, rather than a trailing phase shift, and the third clock has no phase shift relative to the first clock. Because the relative phases of the clocks signals are different after re-enabling the first clock signal, the carefully designed balance of instantaneous loads on the power source, such as a battery, will be upset, resulting in sub-optimal operation (e.g., reduced battery life, increased instantaneous current and higher heat dissipation, etc.).

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, a reference clock is divided by at least a factor of two to generate a master clock signal. A plurality of phase circuits, each independently enabled, generate a plurality of output clock signals by dividing the reference clock signal. The output clock signals have predetermined phase relationships with each other. To ensure that the phase relationships are maintained when a disabled phase circuit is enabled, each phase circuit is synchronized to a synchronization edge (rising or falling) of the master clock signal. A synchronization circuit associated with each phase circuit ensures synchronization with the master clock signal by outputting a phase circuit enable signal only upon the conditions of a clock enable signal associated with the phase circuit being asserted and the receipt of a predetermined number of master clock signal synchronizing edges. The latter may be achieved by clocking the relevant clock enable signal through a chain of series-connected storage elements clocked by the synchronization edge of the master clock signal, and ANDing the output of the chain with the clock enable signal.

One embodiment relates to a method of disabling and enabling clock signals while maintaining the relative phase relationship between them. A reference clock signal is received, and divided by at least a factor of two to generate a master clock signal. A first output clock signal is generated from the reference clock signal and synchronously to the master clock signal in a first phase circuit. In a second phase circuit, a second output clock signal is generated from the reference clock signal and synchronously to the master clock signal. The second output clock signal has a predetermined phase relationship with the first output clock signal. One or more of the first and second phase circuits is disabled to suppress generation of the respective output clock signal(s). A disabled phase circuit is enabled synchronously to the master clock signal, such that after enabling the phase circuit, the first and second output clock signals maintain the predetermined phase relationship.

Another embodiment relates to a clock generator circuit operative to selectively disable and enable clock signals while maintaining predetermined relative phase relationships between them. The clock generator circuit includes an input operative to receive a reference clock signal, and inputs operative to receive first and second output clock enable signals. The clock generator circuit also includes a master clock generator circuit operative to generate a master clock signal by dividing the reference clock signal by at least a factor of two. The clock generator circuit further includes a first phase circuit operative to generate a first output clock signal from the reference clock signal, synchronously to the master clock signal, and a second phase circuit operative to generate a second output clock signal from the reference clock signal, synchronously to the master clock signal. The second output clock signal has a predetermined phase relationship with the first output clock signal. The clock generator circuit additionally includes synchronization circuits associated with each of the phase circuits. Each synchronization circuit is operative to output a phase circuit enable signal only upon the conditions of an output clock enable signal associated with the phase circuit being asserted and the receipt of a predetermined number of master clock signal synchronizing edges. When one of the first and second phase circuits is enabled from a disabled state, the respective output clock signals retain the predetermined phase relationship.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

It should be understood at the outset that although illustrative implementations of one or more embodiments of the present disclosure are provided below, the disclosed systems and/or methods may be implemented using any number of techniques, whether currently known or not yet in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
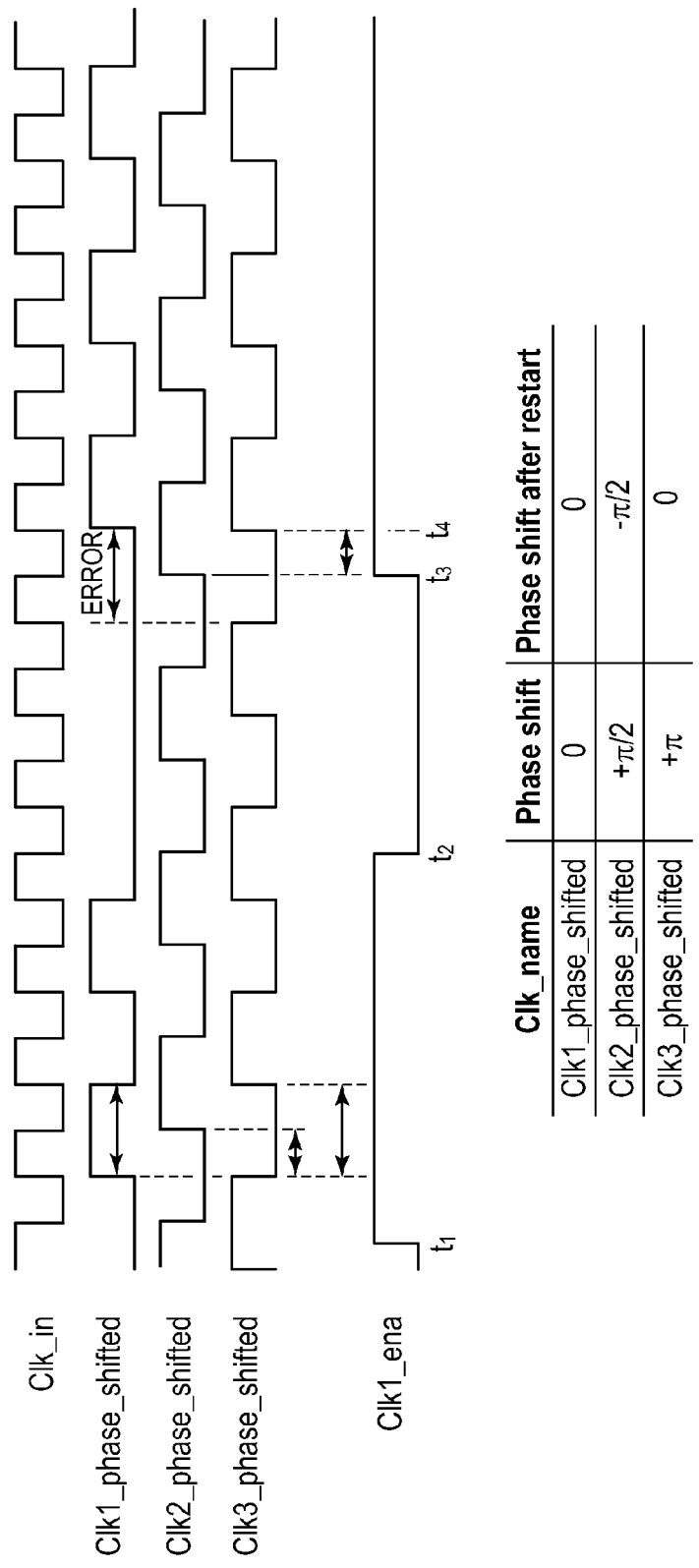
FIG. 1 is a timing diagram depicting various clock signals losing a predetermined phase relationship when one of them is disabled and later re-enabled.
Figure 2:
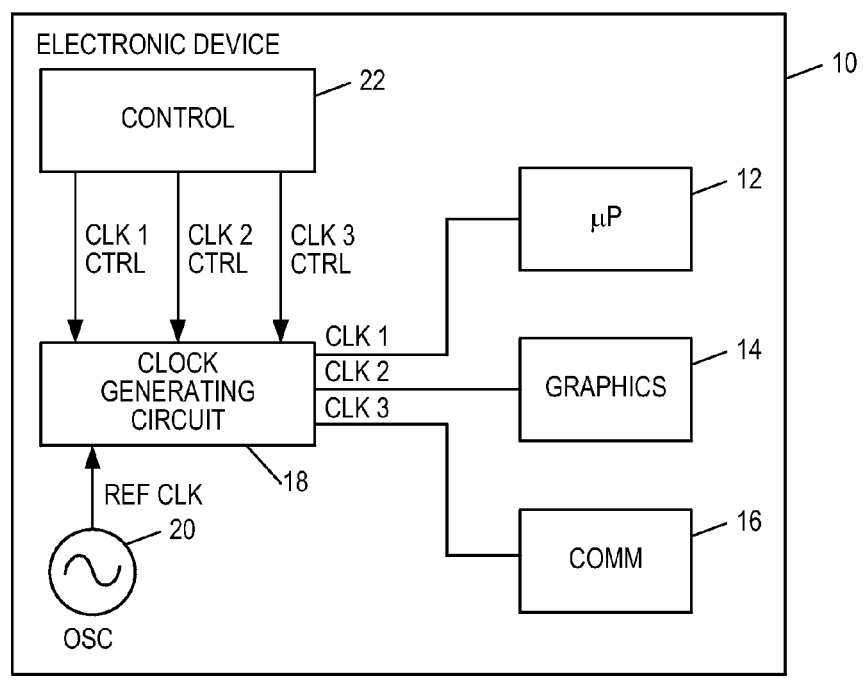
FIG. 2 is a functional block diagram of an electronic device.

FIG. 2 depicts an electronic device 10, which may be a battery-powered portable electronic device, as discussed above. The electronic device 10 includes three digital circuits 12, 14, 16. As a representative, non-limiting example, the circuits may comprise a microprocessor or Digital Signal Processor (DSP) 12, a graphics processing engine 14, and a communication interface 16, which may for example comprise a wireless communication interface, including Radio Frequency (RF) processing circuits. A clock generating circuit 18 generates and distributes a plurality of clock signals to the digital circuits 12, 14, 16. Although FIG. 2 depicts the generated clock signals CLK1, CLK2, and CLK3 as clock inputs for the digital circuits 12, 14, 16, in some embodiments, the generated clock signals may instead drive the switches in dedicated switched mode power supplies (not shown) providing supply voltages to various circuits 12, 14, 16. In either case, it may be important to maintain certain phase offsets between the clock signals, to even out the instantaneous power demands placed on a power source, such as a battery.

The clock signals are generated by dividing a reference clock input, such as from an oscillator 20. The relative phase of the output clock signals CLK1, CLK2, and CLK3 are determined by clock control signals generated by a control circuit 22. The clock control signals comprise at least a clock enable signal for each output clock, allowing each output clock to be enabled or suppressed, independently of the other clock signals. In one embodiment, the clock control signals additionally comprise phase selection bits. In one embodiment, the clock control signals further comprise frequency selection bits. The control circuit 22 may set the relative phase offsets of the output clock signals such that the circuits 12, 14, 16 (or power supplies for them) do not simultaneously change state (or draw charge from a power source). By toggling the clock enable signals, the control circuit 22 may deactivate one or more of the circuits 12, 14, 16 by disabling the output clock signal driving it (or switching its power supply). Upon enabling a disabled circuit 12, 14, 16, it is important that the output clock signals maintain the predetermined phase relationship with each other. The electronic device 10, of course, includes numerous additional circuits and components (user interface, data storage, power source such as a battery, and the like) not germane to the present disclosure and hence not depicted in FIG. 2 for clarity.

The clock generating circuit 18 is operative to maintain the relative phase relationships between output clock signals, when one or more disabled clocks are enabled, by synchronizing all output clocks to an internal master clock signal. The master clock signal is generated by dividing the input reference clock signal by a factor of at least two. The master clock signal is distributed to a synchronization circuit associated with each phase circuit that generates an output clock signal. Each output clock signal is generated by dividing the reference clock signal. The output clocks may be of different frequencies by dividing the reference clock signal by different factors. Each output clock signal is synchronized to a synchronization edge (i.e., either the rising edge or falling edge) of the master clock signal. Because each output clock signal is synchronized to the master clock signal, any phase offset applied to an output clock signal, which generates a phase relationship with the other output clock signals, is maintained through all disable/enable transitions.

Figure 3:
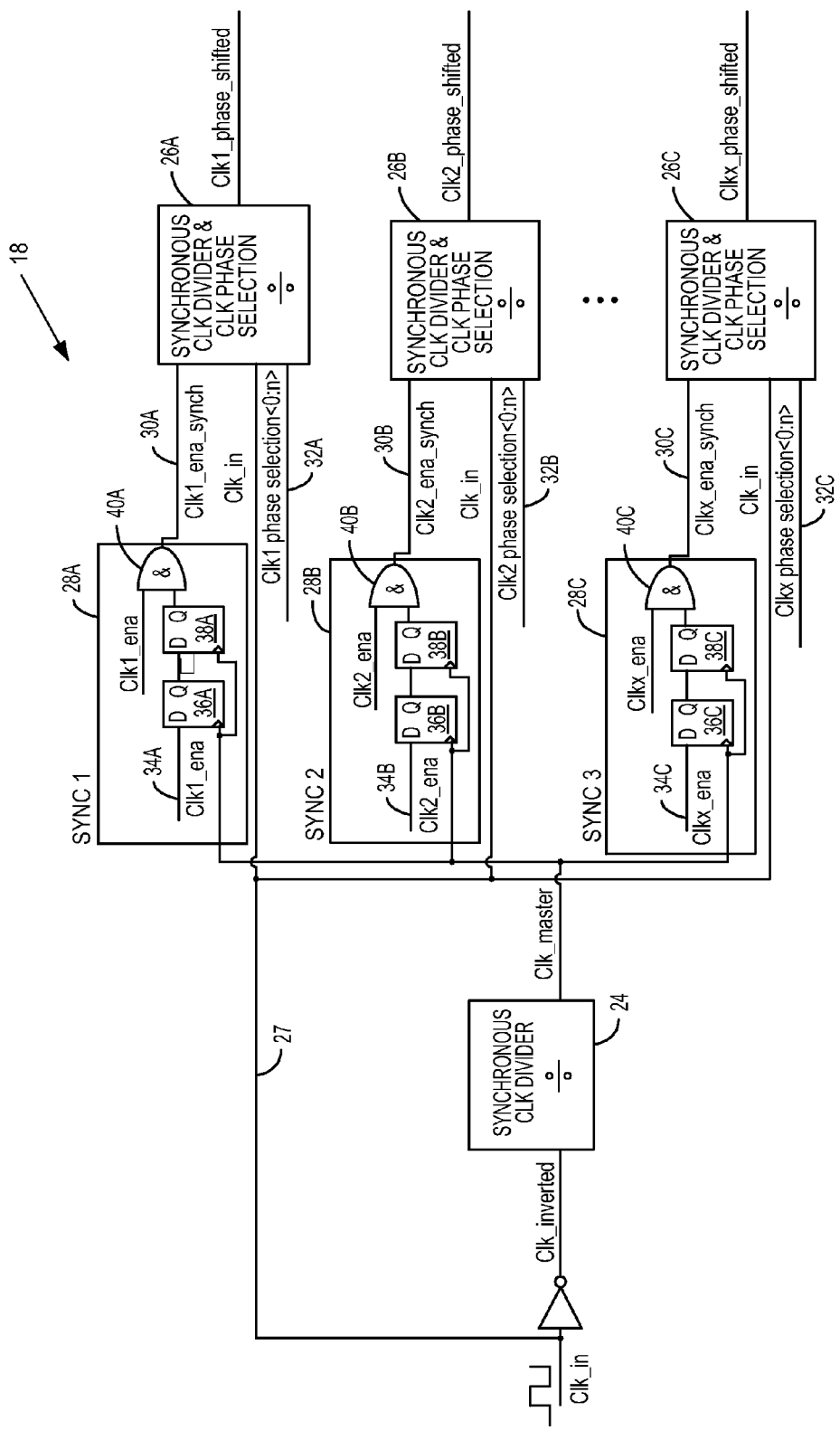
FIG. 3 is a functional block diagram of a clock generating circuit.

FIG. 3 is a functional block diagram of one representative embodiment of the clock generating circuit 18, depicting the generation of three representative output clock signals. The clock generating circuit 18 comprises a clock divider 24, three phase circuits 26A-C, and three synchronization circuits 28A-C.

The synchronous clock divider 24 divides the input reference clock signal 27 by a factor of at least two, to generate a master clock signal 25. The master clock signal 25 is distributed to each synchronization circuit 26A-C. The input reference clock signal 27 is distributed to each phase circuit 26A-C.

Each phase circuit 26A-C is operative to selectively generate an output clock signal. The output clock signal is generated or suppressed in response to a phase circuit enable signal 30A-C output by an associated synchronization circuit 28A-C. Each phase circuit 26A-C may include a clock divider, and hence may generate an output clock signal of a different frequency. In one embodiment, the frequency of the output clock signal is selected by frequency selection bits (not shown), which may form part of the clock control signals received by the clock generation circuit 18 from the control circuit 22. Each phase circuit 26A-C is also operative to apply a phase shift to the generated output clock signal. The phase shift may be fixed (i.e., hardwired), or may be variable, selected by phase selection bits 32A-C, which are part of the clock control signals received by the clock generation circuit 18 from the control circuit 22. Any appropriate clock divider and/or phase shifting circuits, as known in the art, may be utilized in the phase circuits 26A-C. Accordingly, the detailed structure of these functional blocks is not elaborated for clarity.

Each synchronization circuit 28A-C ensures that the enablement of its associated phase circuit 26A-C is synchronized to the synchronization edge of the master clock signal 25, thus preserving the relative phase relationship between output clock signals. Each synchronization circuit 28A-C includes a chain of serially-connected storage elements, such as flip flops 36A-C, 38A-C. The relevant enable signal 34A-C from the control circuit 22 is an input to the chain. Each storage element 36A-C, 38A-C is clocked by the synchronization edge of the master clock signal 25. For example, the flip flops 36A-C, 38A-C depicted in FIG. 3 are clocked by the rising edge of the master clock signal 25; in another embodiment, the falling edge may be the synchronization edge. As known in the art, clocking an input signal (such as the enable signal 34A-C) through two successive, serially-connected flip flops is sufficient to avoid the known problem of metastability, which may result in clocking an analog signal that changes state later than the set-up time required to ensure synchronous operation of the flip flop. In other embodiments, the chain may comprise more or fewer storage elements, or other methods of synchronizing the enable signal 34A-C to the synchronization edge of the master clock signal 25 may be employed.

The output of the chain of storage elements 36A-C, 38A-C—that is, the enable signal 34A-C after synchronization with the master clock signal 25—is logically combined with the clock enable signal 34A-C directly from the control circuit 22 in an AND function 40A. The output of the AND function 40A is a phase circuit enable signal 30A-C, which enables the associated phase circuit 26A-C to begin generating an output clock signal. The phase circuit enable signal 30A-C is thus asserted after an asserted clock enable signal 34A-C is synchronized to the master clock signal 25, and is de-asserted when the clock enable signal 34A-C is de-asserted. Note that the embodiment depicted in FIG. 3 assumes the clock enable signal 34A-C is asserted high; in other embodiments, the signal may be asserted low, in which case logic block 40A-C may differ from the embodiment depicted in FIG. 3.

Those of skill in the art will note that the synchronization of the enable signal 34A-C to the master clock signal 25 requires, in the embodiment depicted in FIG. 3, two cycles of the master clock signal 25, or four cycles of the input reference clock signal 27. This will impose a slight delay between the time the control circuit 22 asserts a clock enable signal 34A-C and the time the associated output clock signal becomes active. In most applications, this delay is negligible and of no consequence. The delay is required to ensure synchronization with the master clock signal 25, which ensures the preservation of relative phase relationships between the output clock signals whenever a phase circuit 26A-C is enabled. On the other hand, the logic block 40A-C ensures that the associated phase circuit 26A-C is disabled, and its output clock signal suppressed, immediately upon de-assertion of the clock enable signal 34A-C by the control circuit 22, as no internal synchronization is required to de-active a clock output signal.

Figure 4:
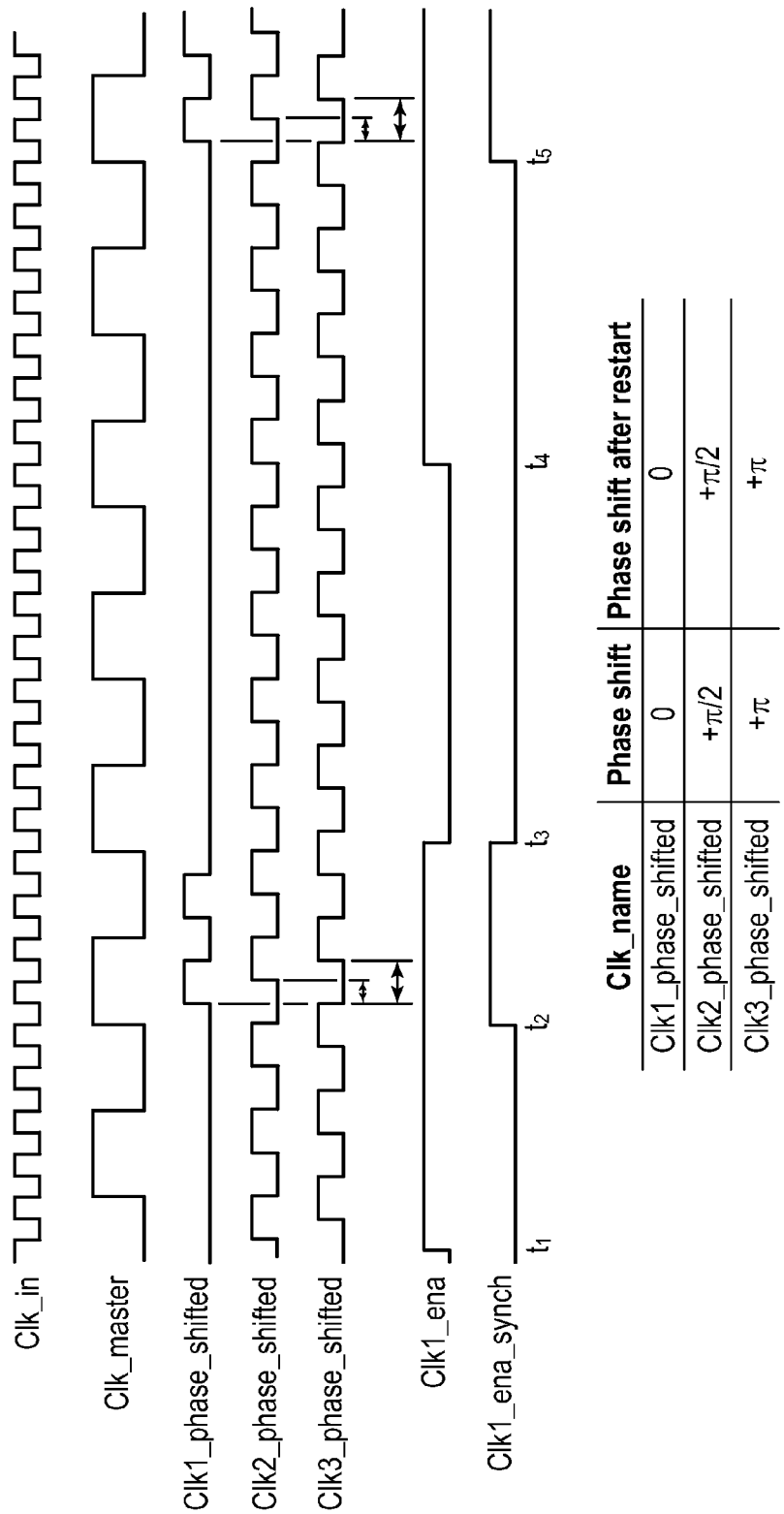
FIG. 4 is a timing diagram depicting various clock signals maintaining a predetermined phase relationship when one of them is disabled and later re-enabled.

FIG. 4 depicts the operation of the clock generating circuit 18, as the first output clock signal is disabled and re-enabled. Initially, only the second and third output clock signals are enabled. The control circuit 22 asserts the clock enable signal 34A for the first output clock signal at time $t_1$. This is signal propagates through the storage elements 36A, 38A and logic block 40A of the synchronization circuit 28A, and the phase circuit enable signal 30A is asserted at time $t_2$. This synchronizes the phase circuit 26A with the synchronization edge (in this case, the rising edge) of the master clock signal 25, and the first output clock signal begins oscillating with the next rising edge of the input reference clock signal 27. The second and third output clock signals—which were similarly synchronized to the master clock signal 25 when the respective phase circuits 26B and 26C were enabled—have the phase offsets relative to the first clock output signal as depicted in the second column of the table. In particular, the second output clock signal has a delay offset from the first clock of π/2, or 90°, and the third output clock has a delay offset from the first clock of π, or 180°.

At time $t_3$, the control circuit 22 de-asserts the clock enable signal 34A for the first output clock signal. Due to the logic block 40A in the synchronization circuit 28A, the phase circuit enable signal 30A to the phase circuit 26A is also de-asserted at this time. This immediately suppresses any oscillation of the first output clock signal.

The enabling of the first output clock signal repeats at time $t_4$, when the control circuit 22 again asserts the clock enable signal 34A for the first output clock signal. Following two rising edges of the master clock signal 25, the phase circuit enable signal 30A is asserted at time $t_5$, and the first output clock signal then begins oscillation. Note that the phase relationships of the second and third output clock signals, as listed in the third column of the table, are the same as those from the prior duration of enablement of the first output clock signal (as listed in the second column). That is, the second output clock signal has a delay offset from the first clock of π/2, or 90°, and the third output clock has a delay offset from the first clock of π, or 180°. Thus, because all of the output clock signals are synchronized to the master clock signal 25 upon being enabled, all of the phase relationships between the output clocks signals are maintained whenever one or more of them are disabled and later re-enabled.

Figure 5:
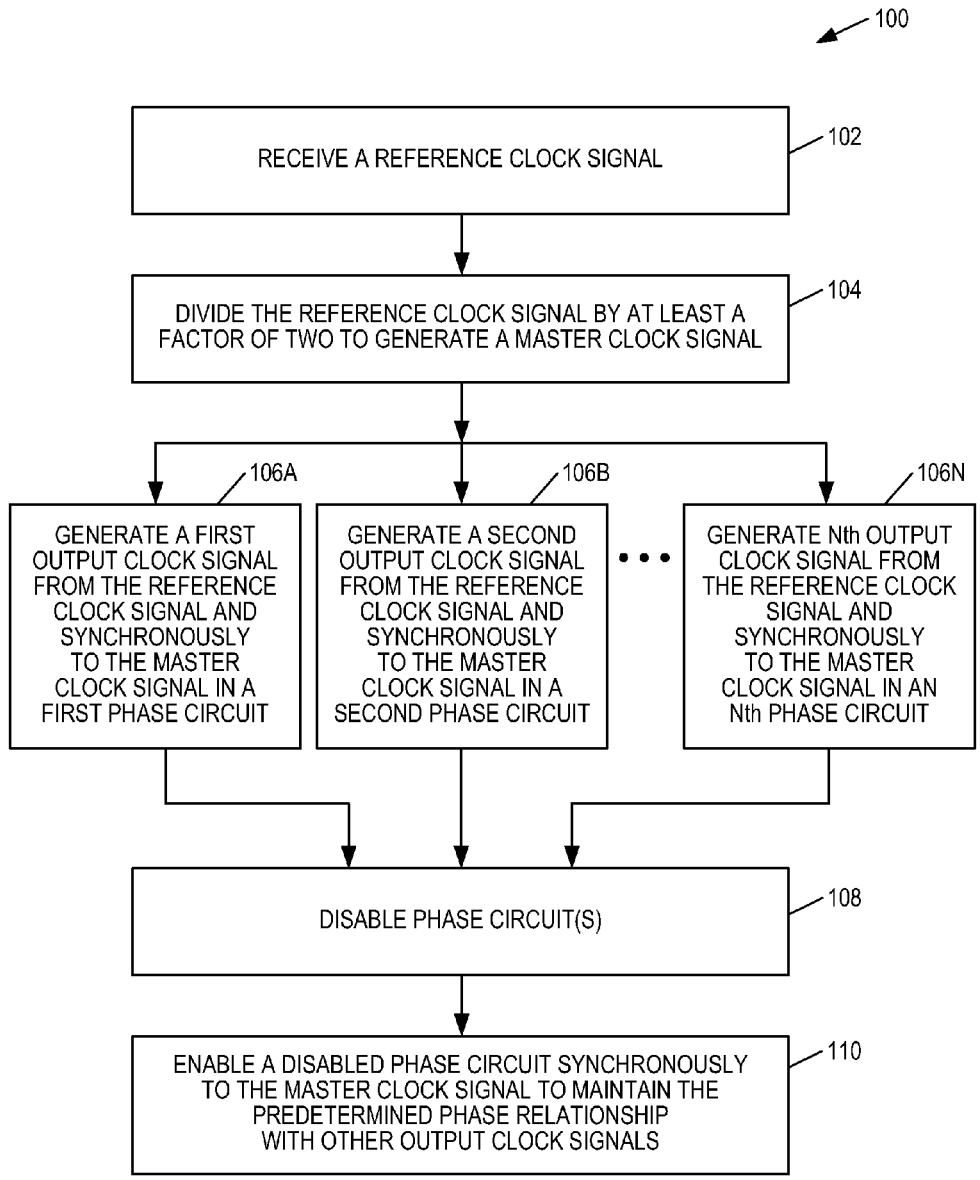
FIG. 5 is a flow diagram of a method of disabling and enabling clock signals while maintaining the relative phase relationship between them.

FIG. 5 depicts a method 100 of disabling and enabling clock signals while maintaining the relative phase relationship between them. A reference clock signal 27 is received, such as from an oscillator 20 (block 102). The reference clock signal 27 is divided by at least a factor of two, to generate a master clock signal 25 (block 104). In each of a plurality of phase circuits 26, an output clock signal is generated from the reference clock signal, synchronously to the master clock signal (blocks 106A, 106B, . . . , 106N). The output clock signals may be of different frequencies, such as by dividing the reference clock signal 27 by different factors. Each of the output clock signals has a predetermined phase relationship to the other output clock signals. In one embodiment, the phase of each output clock signal is determined by phase selection input bits 32, as part of the clock control signals input to the clock generating circuit 18 by the control circuit 22. At least one of the phase circuits 26 is disabled (block 108). Subsequently, the disabled phase circuit is enabled synchronously to the master clock signal 27, to maintain the predetermined phase relationship of the associated output clock signal with the other output clock signals (block 110).

Embodiments of the present invention present the advantage, over prior art clock management techniques, of enabling previously disabled clock signals while maintaining a predetermined phase relationship with other clock signals. This feature is advantageous in a variety of applications, including generating clock signals for switched mode power supplies as well as generating clock signals for digital circuits.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of disabling and enabling clock signals so as to restore a relative phase relationship between them, comprising:

receiving a reference clock signal;

dividing the reference clock signal by at least a factor of two to generate a master clock signal;

generating a first output clock signal from the reference clock signal and synchronously to the master clock signal in a first phase circuit;

generating a second output clock signal from the reference clock signal and synchronously to the master clock signal in a second phase circuit, the second output clock signal having a predetermined phase relationship with the first output clock signal;

disabling one or more of the first and second phase circuits to suppress generation of the respective output clock signal; and enabling a disabled phase circuit synchronously to the master clock signal, such that after enabling the phase circuit, the predetermined phase relationship between the first and second output clock signals is restored.

2. The method of claim 1 wherein enabling a disabled phase circuit synchronously to the master clock signal comprises enabling the phase circuit only upon the conditions of an enable signal associated with the phase circuit being asserted and the receipt of a predetermined number of master clock signal synchronizing edges.

3. The method of claim 2 wherein the predetermined number of master clock signal synchronizing edges is at least two.

4. The method of claim 2 wherein determining the receipt of a predetermined number of master clock signal synchronizing edges comprises clocking a chain comprising a corresponding number of serially connected storage elements with the synchronizing edge of the master clock signal, wherein the phase circuit enable signal is propagated from the input to the output of the chain.

5. The method of claim 4 wherein the phase circuit is enabled only if both the enable signal and the output of the storage element chain are asserted.

6. The method of claim 1 wherein one or more of the first and second phase circuits is further operative to divide the frequency of the reference clock signal.

7. The method of claim 1 wherein one or more of the first and second phase circuits is further operative to output a respective output clock signal having one of a plurality of predetermined relative phase relationships.

8. The method of claim 7 wherein one of the plurality of phase relationships is determined by a phase selection input to the phase circuit.

9. A clock generator circuit operative to selectively disable and enable clock signals so as to restore predetermined relative phase relationships between them, comprising:

an input operative to receive a reference clock signal;

inputs operative to receive first and second output clock enable signals;

a master clock generator circuit operative to generate a master clock signal by dividing the reference clock signal by at least a factor of two;

a first phase circuit operative to generate a first output clock signal from the reference clock signal, synchronously to the master clock signal;

a second phase circuit operative to generate a second output clock signal from the reference clock signal, synchronously to the master clock signal, the second output clock signal having a predetermined phase relationship with the first output clock signal; and synchronization circuits associated with each of the phase circuits, each synchronization circuit operative to output a phase circuit enable signal only upon the conditions of an output clock enable signal associated with the phase circuit being asserted and the receipt of a predetermined number of master clock signal synchronizing edges;

whereby when one of the first and second phase circuits is enabled from a disabled state, the predetermined phase relationship between the respective output clock signals is restored.

10. The clock generator circuit of claim 9 wherein each synchronization circuit comprises a serially-connected chain of storage elements, each clocked by a synchronizing edge of the master clock signal, wherein the phase circuit enable signal is propagated from the input to the output of the chain.

11. The clock generator circuit of claim 10 wherein each synchronization circuit further comprises logic to enabled the associated phase circuit only if both the enable signal and the output of the storage element chain are asserted.

12. The clock generator circuit of claim 9 wherein one or more of the first and second phase circuits are further operative to divide the frequency of the reference clock signal.

13. The clock generator circuit of claim 9 wherein one or more of the first and second phase circuits are further operative to output a respective output clock signal having one of a plurality of predetermined relative phase relationships.

14. The clock generator circuit of claim 13 wherein one of the plurality of phase relationships is determined by a phase selection input to the phase circuit.

\* \* \* \* \*